July 4, 1972 T. G. ATHANAS 3,674,551
FORMATION OF OPENINGS IN INSULATING LAYERS IN MOS SEMICONDUCTOR DEVICES
Filed Oct. 12, 1970 2 Sheets-Sheet 1
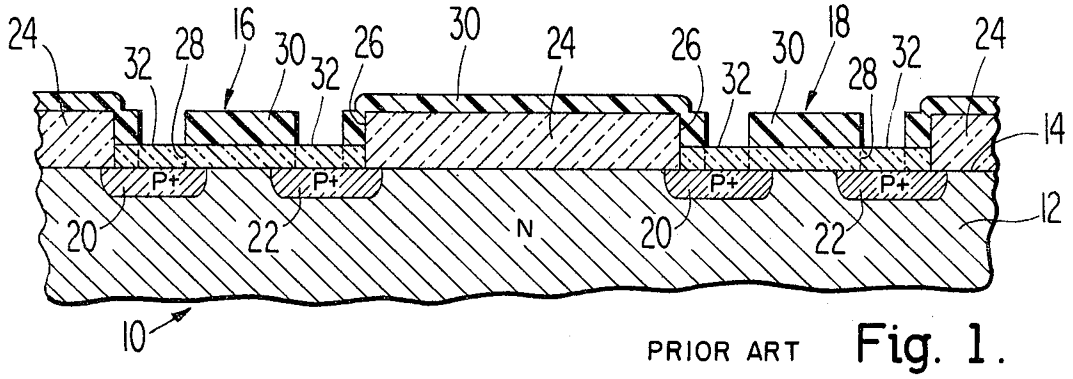
PRIOR ART Fig. 1.
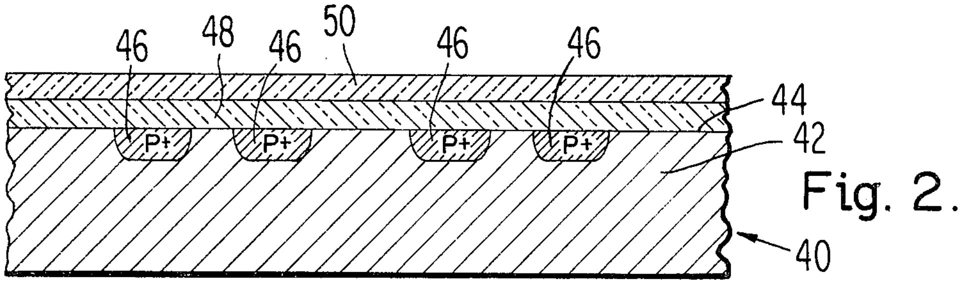
Fig. 2.
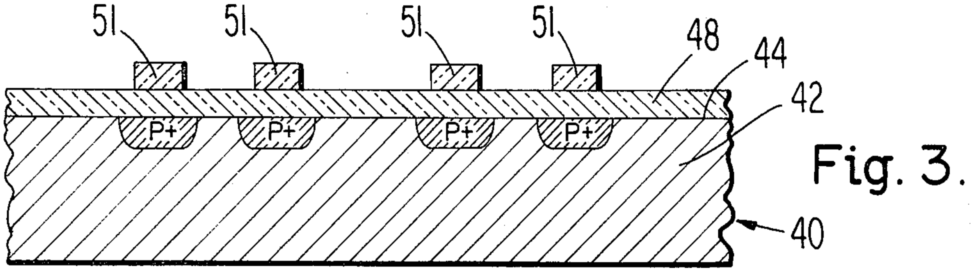
Fig. 3.
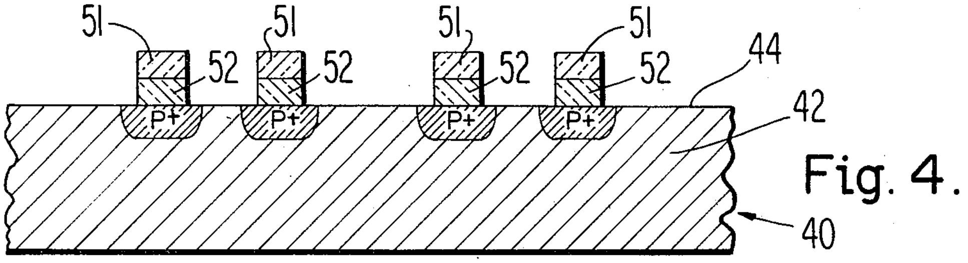
Fig. 4.
INVENTOR.
Terry G. Athanas
BY
[signature]
ATTORNEY INVENTOR.
Terry G. Athanas
BY
Glenn A. Burnette
ATTORNEY United States Patent Office 3,674,551

Patented July 4, 1972

3,674,551

FORMATION OF OPENINGS IN INSULATING LAYERS IN MOS SEMICONDUCTOR DEVICES

Terry George Athanas, Lebanon, N.J., assignor to RCA Corporation

Filed Oct. 12, 1970, Ser. No. 79,982
Int. Cl. C23f *1/02*
U.S. Cl. 117—212 9 Claims

ABSTRACT OF THE DISCLOSURE

Small openings in insulating coatings on MOS semiconductor devices are defined by (1) forming, on the surface of a semiconductor wafer at the desired locations for the openings, masking bodies of a material which is soluble in a given solvent; (2) depositing over the entire wafer a coating of a material which is not soluble in that solvent; (3) etching this coating in a suitable solvent to expose the masking bodies formed in step (1) and portions of the surface of the wafer; (4) oxidizing the exposed portions of the surface of the wafer; and, finally (5) removing the masking bodies in the given solvent.

BACKGROUND OF THE INVENTION

This invention relates to the fabrication of semiconductor devices. More particularly, the invention pertains to a method of forming small openings in insulating coatings in semiconductor integrated circuit devices.

A semiconductor device to which the present method is applicable is the so-called MOS integrated circuit device. This device is formed in a body of semiconductive material which has a surface adjacent to which the active devices of the circuit are formed. In the manufacture of the device, it has been common to form a relatively thick layer of passivating oxide on this surface; to form openings in this passivating oxide adjacent to the active devices; then to oxidize the semiconductive material in the openings under carefully controlled conditions to form a relatively thin gate insulating oxide; and, finally, to form contact openings in the gate insulating oxide. The difference in thickness of the thick and thin oxides may be 10,000 A. or more.

In the prior art process, it has been difficult to define the contact openings, which must necessarily be within the boundaries of the oxide step at the juncture of the thick and thin oxides. Yield losses, due to misalignment of the contact openings or due to inadequate photoresist uniformity, increase as the area of the individual transistors, and necessarily the size of the depression defined by the oxide step, is decreased. Moreover, photoresist tends to accumulate in the depression in the oxide, resulting in a coating which is too thick for accurate definition.

It is known to provide openings in an insulating coating on a semiconductor surface by applying, to the portions of the surface where the openings are desired, masking bodies of a given material, then oxidizing the unmasked surface, and finally removing the masking bodies in a solvent which will not attack the oxidized surface. This process as such is not applicable to MOS devices which require a passivating coating of 10,000 A. or more. To produce such a coating by thermal oxidation is not practical because high temperatures and long oxidation times are required.

SUMMARY OF THE INVENTION

The present novel process includes the steps of forming on a semiconductor wafer surface at the locations where contact openings are desired, a plurality of masking bodies of a material which is soluble in a predetermined solvent, depositing a coating of a material which is not soluble in that solvent, removing portions of this coating to expose the masking bodies and portions of the wafer surface, oxidizing the exposed surface portions, and then removing the bodies with the appropriate solvent.

THE DRAWINGS

FIG. 1 is a cross sectional view of a portion of an MOS integrated circuit device at an intermediate stage of its manufacture according to the process of the prior art.

FIGS. 2 to 8 are a sequence of cross sectional views illustrating the steps of the present novel process.

DETAILED DESCRIPTION

Figure 5:
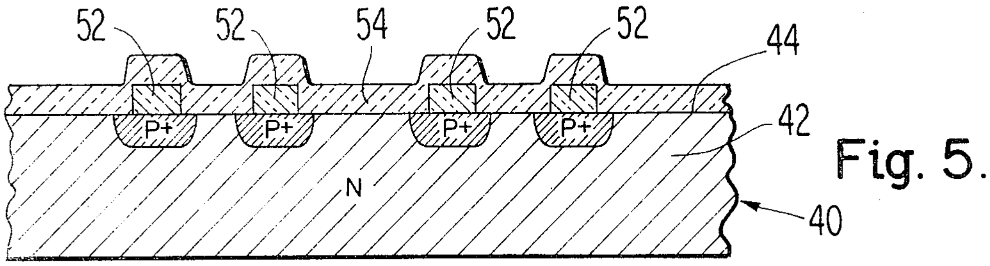
Figure 6:
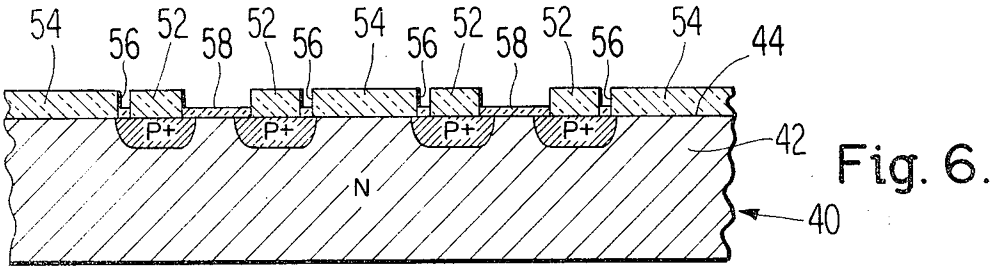
Figure 7:
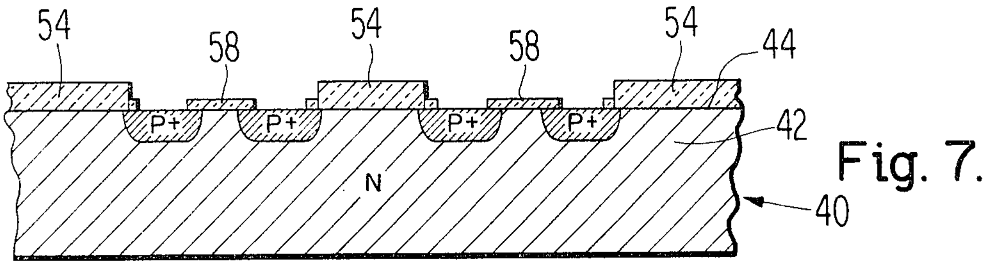

The situation at the stage in the process of the prior art in which contact openings are formed is illustrated in FIG. 1. As shown, there is a portion of an integrated circuit device 10 which consists of a substrate body 12 of semiconductive material, usually silicon, which has a surface 14 adjacent to which the active regions of the device are formed. The intermediate structures of two MOS insulated gate field effect transistors 16 and 18 are shown in FIG. 1. Each of these intermediate transistor structures includes a source region 20 and a drain region 22, formed by diffusion in known manner adjacent to the surface 14.

After the formation of the sources 20 and the drains 22 in the device 10, a thick coating 24, of silicon dioxide, for example, is formed over the entire surface 14. Openings, indicated by the numeral 26, are formed in the coating 24 by etching at the areas adjacent to each of the transistors. Thereafter, an oxide coating 28 is formed by thermal oxidation of the semiconductive material of the body 12 under carefully controlled conditions so that contaminating substances such as sodium are avoided.

The actual contact opening step in the prior process is carried out by forming a masking coating 30 of a known photoresist material on the exposed upper surfaces of the device 10 over all portions thereof except for the locations of the desired contact openings. These locations are indicated at 32 in FIG. 1. Subsequently, the device 10 is immersed in a solvent for the silicon dioxide of the coatings 28 so as to form the desired contact openings, the boundaries of which are indicated in dotted lines.

Manufacturing yields in the prior process are directly related to the accuracy with which the photoresist coating 30 is placed on the device 10 and to the uniformity of quality of the photoresist coating 30. A particular disadvantage is the fact that the photoresist accumulates in the openings 26 during its application. The resulting coating is too thick for accurate photolithography. Note the relative thicknesses of the coating 30 suggested in FIG. 1.

The present novel process, outlined in FIGS. 2 to 8, is independent of a final photoresist coating to define contact openings. The process is described with reference to a portion of an integrated circuit device 40 which includes a substrate body 42 of semiconductive material, like the prior art material, which has an upper surface 44 adjacent to which active regions 46 of the device 40 are formed.

Deviation from conventional processing begins with the configuration shown in FIG. 2. Here, there is shown a first coating 48 on the surface 44 which is comprised of a material which can be etched by a given solvent which is not a solvent for silicon dioxide. Suitable materials are silicon nitride, aluminum oxide, and aluminum silicate, all of which can be etched by hot phosphoric acid. Where the coating 48 is silicon nitride, it may be applied by vapor deposition on the surface 44 by heating the device 40 in an atmosphere of silane ($SiH_4$), ammonia, and hydrogen, at a temperature of about 850 to 900° C. On the coating 48 is a coating 50 of a material which can be etched by a solvent which will not dissolve the material of the coating 48. Suitable materials are silicon oxide, molybdenum, or platinum. Silicon dioxide, formed by the pyrolytic decomposition of silane ($SiH_4$) in the presence of oxygen, is preferred.

The next step in the present process is to remove portions of the coating 50 so as to leave masking bodies 51 in the shape of the desired contact openings and located at the desired locations for the contact openings. Thereafter, the coating 48 is exposed to a solvent, such as hot phosphoric acid, with the result shown in FIG. 4, that is, portions 52 of the coating 48 remain. The device 40 may then be exposed to a solvent for the material of the coating 50 to remove the bodies 51.

A deposited coating 54 of silicon dioxide is next formed over the entire upper surface of the device 40 as shown in FIG. 5, preferably by the pyrolysis of silane in the presence of oxygen. Portions of the coating 54 will eventually become thick protective coatings on the surface of the device 40, as follows. A mask similar to the mask used to form the openings 26 in the prior art process described in FIG. 1, is next used to provide openings, designated by the numerals 56 in FIG. 6 at the desired locations for the transistors. Since the solvent (HF) used for the formation of these openings does not attack the bodies 52, these bodies will remain, as shown. Portions of the surface 44 adjacent to the bodies 52 and between adjacent pairs thereof are also exposed. The next step is to form a gate insulating oxide 58 on the exposed portions of the surface 44. This gate insulating oxide is formed in the same manner as in the prior art process, i.e., by heating the device 40 is an oxidizing atmosphere under carefully controlled conditions of cleanliness. Next, as illustrated in FIG. 4, the bodies 52 are removed. This is accomplished by exposing them to a solvent such as hot phosphoric acid which will not attack silicon dioxide.

Figure 8:
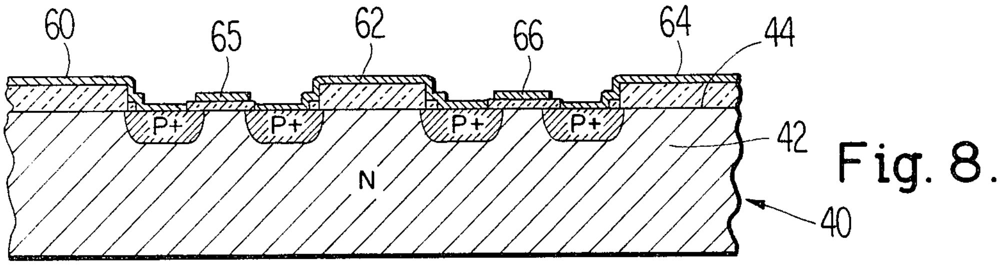

The last step in the present process is the deposition and definition of an interconnection metal pattern, as illustrated in FIG. 8. As shown, there is a deposited metal contact 60, an interconnection contact 62, another contact 64 and gate electrodes 65 and 66, respectively, which provide complete transistors.

By means of the present process the critical alignment of the contact opening mask of the prior art is avoided. Moreover, the process does not depend for its accuracy on the inherent quality of a photoresist coating, since the openings are defined by the positive and observable bodies 52. Extremely small contacts can be achieved because they are defined on a flat wafer surface rather than on a surface with high oxide steps. Because of the smaller contact, smaller devices may be formed.

The present process has other advantages as well. A cleaner gate insulating oxide is realized because photoresist never contacts this oxide. Finally, higher yields in manufacturing may be expected from this process because the final contact opening step is accomplished with a solvent which does not attach silicon dioxide and, therefore, does not produce pinhole defects.

What is claimed is:

1. A process of making a semiconductor device including a body of semiconductive material having a surface comprising the steps of:

forming on said surface a plurality of masking bodies of a material which is soluble in a predetermined solvent which is not a solvent for silicon dioxide, forming on said surface and said bodies a coating of silicon dioxide, removing portions of said silicon dioxide coating to expose said masking bodies and portions of said surface adjacent to said masking bodies, oxidizing the exposed portions of said surface, and contacting said masking bodies with said solvent to remove them from said surface.

2. A process as defined in claim 1 wherein said masking bodies are of silicon nitride.

3. A process as defined in claim 2 wherein said silicon nitride bodies are formed by:

heating said semiconductive material at a temperature between about 850° C. and about 900° C. in an atmosphere containing silane and ammonia to form a silicon nitride coating on said surface, applying an etch resistant mask to those portions intended to become said bodies, and contacting the unmasked portions of said coating with a solvent for silicon nitride for a time sufficient to expose said semiconductive material.

4. A process as defined in claim 2 wherein said silicon dioxide coating is formed by heating said body in an atmosphere containing silane and oxygen.

5. A process of making an integrated circuit device including a plurality of insulated gate field effect transistors formed in a body of semiconductive material having a surface, each insulated gate field effect transistor including spaced source and drain regions and a channel region therebetween and occupying some predetermined area on said surface comprising:

forming a plurality of bodies of silicon nitride on said surface within the areas occupied by said insulated gate field effect transistors adjacent to each region where contact to said semiconductive material is desired, depositing over at least those portions of said surface not occupied by said silicon nitride bodies a coating of silicon dioxide of predetermined thickness, removing by masking and etching portions of said silicon dioxide coating adjacent to the areas occupied by said insulated gate field effect transistors to expose the surface of said body, forming a coating of silicon dioxide of substantially lesser thickness than that of the aforementioned silicon dioxide coating on the exposed surfaces of said body, and contacting said silicon nitride bodies with a solvent which will not attack silicon dioxide for a time adequate to remove said bodies.

6. A process as defined in claim 5 wherein said silicon nitride coating is formed by heating said body at a temperature of about 850° C. to about 900° C. in an atmosphere containing silane and ammonia.

7. A process as defined in claim 6 wherein said solvent is hot phosphoric acid.

8. A process as defined in claim 5 wherein said first mentioned silicon dioxide coating is formed by the pyrolysis of silane and wherein said predetermined thickness is greater than about 10,000 A.

9. A process as defined in claim 8 wherein said second-mentioned silicon dioxide coating is formed by thermal oxidation of the exposed surfaces of said body.

References Cited

UNITED STATES PATENTS

| | | | |
|---|---|---|---|
| 3,479,237 | 11/1969 | Bergh et al. | 117—DIG. 12 |
| 3,455,020 | 7/1969 | Dawson et al. | 117—DIG. 12 |
| 3,460,007 | 8/1969 | Scott, Jr. | 117—DIG. 12 |

FOREIGN PATENTS

| | | | |
|---|---|---|---|
| 826,343 | 10/1969 | Canada | 117—212 |
| 804,234 | 1/1969 | Canada | 117—212 |

OTHER REFERENCES

Powell: Oxley, Blocker "Vapor Deposition," John Wiley & Sons, 1966, pp. 391-397.

RALPH S. KENDALL, Primary Examiner

U.S. Cl. X.R.

117—106 R, 5.5, 217, DIG. 12; 156—11